United States Patent
P et al.

(10) Patent No.: US 12,019,964 B1
(45) Date of Patent: Jun. 25, 2024

(54) OPTIMIZING USE OF COMPUTER RESOURCES IN IMPLEMENTING CIRCUIT DESIGNS THROUGH MACHINE LEARNING

(71) Applicant: Xilinx, Inc., San Jose, CA (US)

(72) Inventors: Karthic P, Chennai (IN); Paul Kundarewich, Toronto (CA); Satish Sivaswamy, Fremont, CA (US); Meghraj Kalase, Hyderabad (IN); Vishal Tripathi, Hyderabad (IN); Srinivasan Dasasathyan, Secunderabad (IN); Mehrdad Eslami Dehkordi, Los Gatos, CA (US); Xiaojian Yang, Santa Clara, CA (US); Amish Pandya, San Ramon, CA (US)

(73) Assignee: XILINX, INC., San Jose, CA (US)

( * ) Notice: Subject to any disclaimer, the term of this patent is extended or adjusted under 35 U.S.C. 154(b) by 306 days.

(21) Appl. No.: 17/376,892

(22) Filed: Jul. 15, 2021

(51) Int. Cl.
  *G06F 30/337* (2020.01)
  *G06F 30/392* (2020.01)
  *G06N 20/00* (2019.01)

(52) U.S. Cl.
  CPC .......... *G06F 30/337* (2020.01); *G06F 30/392* (2020.01); *G06N 20/00* (2019.01)

(58) Field of Classification Search
  CPC ...... G06F 30/337; G06F 30/392; G06N 20/00
  See application file for complete search history.

(56) References Cited

U.S. PATENT DOCUMENTS

| | | | | |
|---|---|---|---|---|
| 7,434,185 B2 * | 10/2008 | Dooling | ................ | G06F 30/398 716/136 |
| 7,657,856 B1 * | 2/2010 | Koshy | ................... | G06F 30/398 716/124 |
| 7,904,852 B1 * | 3/2011 | Cadouri | ................ | G06F 30/398 703/22 |
| 7,913,194 B1 * | 3/2011 | Baylor | .................. | G06F 30/327 716/124 |
| 7,913,206 B1 * | 3/2011 | Cadouri | ................ | G06F 30/398 716/112 |

(Continued)

OTHER PUBLICATIONS

Tin Kam Ho, "Random Decision Forests", Proceedings of the 3rd International Conference on Document Analysis and Recognition, Montreal, QC, Aug. 14-16, 1995. pp. 278-282.

(Continued)

*Primary Examiner* — Nha T Nguyen
(74) *Attorney, Agent, or Firm* — Crawford Maunu PLLC

(57) ABSTRACT

Methods and systems for selecting between single-process and multi-process implementation flows involve identifying features of a circuit design by a design tool. A classification model is applied to the features. The classification model indicates whether an implementation flow on the circuit design is likely to have a runtime within a first range of runtimes or a runtime within a second range of runtimes. The implementation flow is executed by the design tool in a single process in response to the classification model indicating the implementation flow on the circuit design is likely to have a runtime within the first range of runtimes. The implementation flow is executed by the design tool in a plurality of processes in response to the classification model indicating the implementation flow on the circuit design is likely to have a runtime within the second range of runtimes.

20 Claims, 5 Drawing Sheets

(56) References Cited

U.S. PATENT DOCUMENTS

| | | | | |
|---|---|---|---|---|
| 8,099,693 | B2* | 1/2012 | Pedenon | G06F 30/30 |
| | | | | 716/101 |
| 8,214,775 | B2* | 7/2012 | Gergov | G03F 1/68 |
| | | | | 716/55 |
| 9,418,188 | B1* | 8/2016 | Hathaway | G06F 30/392 |
| 9,594,859 | B1* | 3/2017 | Padalia | G06F 17/10 |
| 11,003,826 | B1* | 5/2021 | Dasasathyan | G06F 30/392 |
| 11,003,827 | B1* | 5/2021 | Kundarewich | G06F 30/347 |
| 11,093,441 | B2* | 8/2021 | Park | G06F 11/3024 |
| 2002/0049956 | A1* | 4/2002 | Bozkus | G06F 30/398 |
| | | | | 716/111 |
| 2004/0215939 | A1* | 10/2004 | Armstrong | G06F 9/485 |
| | | | | 712/E9.035 |
| 2007/0233805 | A1* | 10/2007 | Grodd | G06F 9/5066 |
| | | | | 709/208 |
| 2009/0172623 | A1* | 7/2009 | Cross | G06F 30/30 |
| | | | | 716/119 |
| 2010/0115478 | A1* | 5/2010 | Pedenon | G06F 30/30 |
| | | | | 716/136 |
| 2015/0007120 | A1* | 1/2015 | Erickson | G06F 30/34 |
| | | | | 716/105 |
| 2021/0287120 | A1* | 9/2021 | Mamidi | G06N 20/00 |
| 2022/0004900 | A1* | 1/2022 | Salahuddin | G06F 30/27 |
| 2022/0374327 | A1* | 11/2022 | Engel | G06F 11/302 |

OTHER PUBLICATIONS sklearn.model selection.GridSearchCV, https://scikit-learn.org/stable/modules/generated/sklearn.model_selection.GridSearchCV.html, Copywrite 2007-2020, Scikit-learn developers (BSD License), downloaded May 25, 2021.

3.1. Cross-validation: evaluating estimator performance, https://scikit-learn.org/stable/modules/cross_validation.html, Copywrite 2007-2020, Scikit-learn developers (BSD License), downloaded May 25, 2021.

* cited by examiner

OPTIMIZING USE OF COMPUTER RESOURCES IN IMPLEMENTING CIRCUIT DESIGNS THROUGH MACHINE LEARNING

TECHNICAL FIELD

The disclosure generally relates to reducing runtimes of a design tool in processing circuit designs.

BACKGROUND

Implementing a circuit from a circuit design generally includes phases of logic synthesis and optimization, place, and route. An implementation flow can include additional phases to generate the data from which a physical integrated circuit die can be manufactured or a programmable device can be configured. The implementation flow is performed by a design tool(s) executing on a computing arrangement, and the runtime for implementing a design depends on the size and complexity of the circuit design.

Some organizations provide services that involve implementing a large number of designs, and clusters of multiple computers are used to perform the implementation flows. Each computer can have multiple processor cores. In managing the computing resources, these organizations sometimes will run the implementation flows for a large set of designs on a cluster, with an objective of minimizing the runtime devoted to the implementation flows.

To reduce the runtimes of implementation flows, some design tools support dividing a design into partitions and processing the partitions as parallel processes. The capability to divide the design and process partitions in parallel can be referred to as a "multi-process flow." In some instances, an organization may have insufficient computing resources to run implementation flows on all the designs using multi-process flows. Thus, the total time to complete implementation flows for all the designs could be reduced by devoting multi-process flow computing resources to only those designs for which the implementation flows have long runtimes.

SUMMARY

A disclosed method includes identifying features of a circuit design by a design tool and applying a classification model to the features. The classification model indicates whether an implementation flow on the circuit design is likely to have a runtime within a first range of runtimes or a runtime within a second range of runtimes. The implementation flow is executed by the design tool in a single process in response to the classification model indicating the implementation flow on the circuit design is likely to have a runtime within the first range of runtimes. The implementation flow is executed by the design tool in response to the classification model indicating the implementation flow on the circuit design is likely to have a runtime within the second range of runtimes.

Another disclosed method includes executing a design tool that performs implementation flows on a plurality of circuit designs of a training set and determining respective runtime durations of the implementation flows. For each implementation flow, the tool determines a respective label value that is one of two or more possible label values and is based on the runtime durations of the implementation flows. Each label value corresponds to a range of runtimes. The tool extracts respective sets of features from the plurality of circuit designs and associates the label values with the sets of features of the circuit designs. The tool builds a classification model based on the label values and associated sets of features. The classification model is configured to determine a label value in response to input of a set of features of a particular circuit design, and the determined label value indicates a runtime duration expected for the particular circuit design.

Another method includes processing a circuit design through a first stage of an implementation flow by a design tool and identifying features of the circuit design in response to completion of the first stage. The design tool applies a first classification model to the features. The first classification model indicates whether the design tool should perform a second stage of the implementation flow as a plurality of parallel processes or as a single process based on the features. The second stage is executed by the plurality of processes in response to the first classification model indicating the design tool should perform the second stage by the plurality of parallel processes. The second stage is executed by the single process in response to first classification model indicating the design tool should perform the second stage as the single process. The method includes identifying features of the circuit design in response to completion of the second stage, and applying a second classification model to the features. The second classification model indicates whether the design tool should perform a third stage of the implementation flow as a plurality of parallel processes or as a single process based on the features. The method includes executing the third stage by the plurality of processes in response to the second classification model indicating the design tool should perform the third stage by the plurality of parallel processes. The method includes executing the third stage by the single process in response to the second classification model indicating the design tool should perform the third stage as the single process.

Other features will be recognized from consideration of the Detailed Description and Claims, which follow.

BRIEF DESCRIPTION OF THE DRAWINGS

Various aspects and features of the methods and systems will become apparent upon review of the following detailed description and upon reference to the drawings in which.

DETAILED DESCRIPTION

Figure 1:
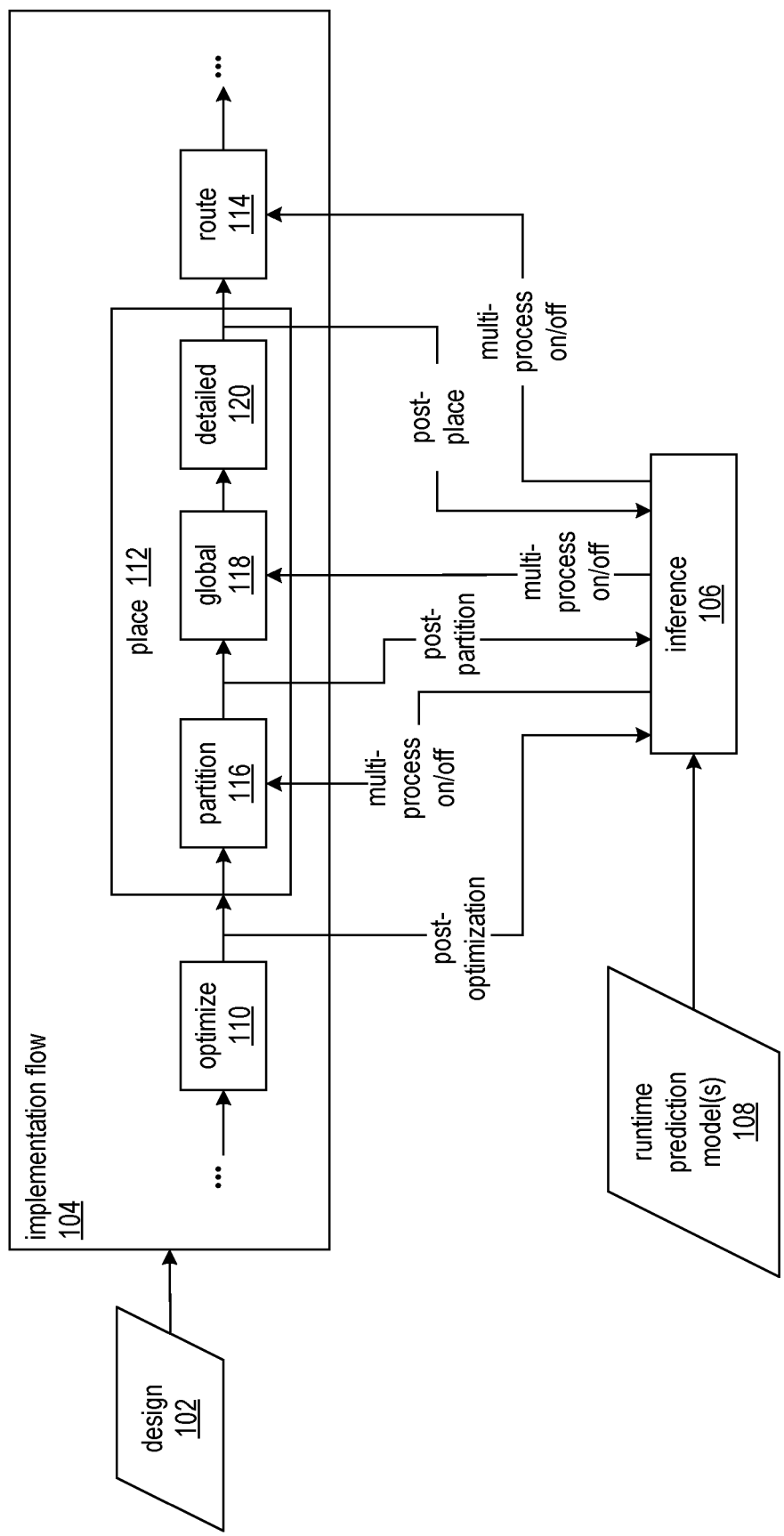
FIG. 1 shows a flow diagram of an exemplary implementation flow in which a runtime prediction model(s) is used to selectively activate single-process or multi-process flows by the design tool.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

According to the disclosed methods and systems, machine learning techniques are used to identify those circuit designs for which implementations flows are likely to have short runtimes and those circuit designs for which implementations flows are likely to have long runtimes. The short/long runtime predictions can be used to efficiently allocate computer resources for the implementation flows.

In an exemplary scenario in which predictions of short/long runtimes of implementation flows may be beneficial, a circuit design tool can select between single-process and multi-process implementation flows for circuit designs that are to be processed as a group. In this scenario, an organization may not have sufficient computing resources to execute multi-process implementation flows for all designs concurrently, but have sufficient computing resources to execute multi-process implementation flows for some of the designs concurrently. Process resources (memory and threads) assigned to shorter runtime designs cannot be used at the same time for longer runtime designs. Therefore, assigning process resources to long runtime designs instead of short runtime designs can reduce the overall time spent in implementation flows for multiple designs that are processed as a group. Single-process implementation flows can be performed on designs for which the runtime of the implementation flow is likely to be short, and multi-process implementation flows can be performed on those designs for which the runtime of the implementation flow is likely to be long.

A "single-process" implementation flow refers one or more threads of execution of the design tool in which the threads share an address space in a memory arrangement of a host computer system. A "multi-process" implementation flow refers to multiple threads (or groups of one or more threads) in which each group has a dedicated address space. In a multi-process implementation flow, the address space accessed by the threads of one group is not accessible to the threads of another group.

According to one aspect of the disclosed methods and systems, one or more classification models can be applied to features of a circuit design to predict whether the implementation flow is likely to have a short runtime or a long runtime. Based on the prediction, the design tool can selectively activate either a single-process or multi-process flow.

According to another aspect of the disclosed methods and systems, in training the classification model(s), implementation flows are executed by a design tool on the circuit designs of a training set. Based on the runtimes of the implementation flows, label values are determined. According to an exemplary approach, the label value can indicate either a short runtime or a long runtime, such as logical 0 indicating short runtime and logical 1 indicating a long runtime. A runtime within a range of runtimes less than a runtime threshold can produce label value 0, and a runtime within the range of runtimes greater than the threshold can produce a label value 1. In other exemplary approaches, more than two ranges of runtimes can be represented by a corresponding number of label values. The training process extracts sets of features of the circuit designs and associates the label values with the sets of features. The classification model(s) can be built using the features sets and associated label values.

FIG. 1 shows a flow diagram of an exemplary implementation flow in which a runtime prediction model(s) is used to selectively activate single-process or multi-process flows by the design tool. The runtime prediction model(s) (or "classification" model(s)) can be applied at multiple times during the flow to predict short or long runtimes, and based on the predictions determine whether a single-process or multi-process flows are desirable. A circuit design tool(s), such as available in the VIVADO® tool software suite from Xilinx, Inc., or another tool(s) having comparable capabilities, can be configured consistent with the description that follows.

The circuit design tool inputs circuit design 102 and performs the implementation flow 104. At one or more times during the progression of the implementation flow, the design tool invokes the inference engine 106, which uses the runtime prediction model(s) 108 to determine whether the features of the circuit design suggest a short runtime or a long runtime.

The implementation flow 104 generally includes optimization stage 110, placement stage 112, and routing stage 114. Only a subset of the stages/phases of an implementation flow are shown in order to demonstrate that runtime prediction can be employed at multiple points in the implementation flow. It will be recognized that an implementation flow can include additional stages/phases, such as synthesis, various optimizations, and generating configuration bitstreams. Runtime prediction can be activated at different stages/phases than those illustrated based on a user's objectives.

According to an exemplary use of runtime prediction model(s) 108 by a design tool in an implementation flow, the inference engine 106 can be invoked at three points in the flow. The inference engine 106 and runtime prediction model(s) 108 can be implemented as a random forest classifier. Alternative binary classification models that could be used in the disclosed methods and systems include decision trees, boosted trees, warm-start classification methods, support vector machines, or convolutional neural networks.

The exemplary flow uses three runtime prediction models 108, one at the completion of each stage/phase. The exemplary models include a post-optimization model, a post-partition model, and a post-placement model. Each model uses the features of the circuit design that are available at completion of the corresponding stage/phase to predict whether the overall runtime of the implementation flow is likely to be short or long. As the implementation flow progresses through the stages/phases, additional features are available to more accurately predict whether the runtime will be short or long.

The design tool performs logic optimization in the optimization stage 110, and in response to completing the optimization invokes the inference engine 106 to predict whether the implementation flow will have a short or long runtime based on application of the post-optimization model to circuit design features that are available post-optimization. Examples of features that can be extracted from the circuit design post-optimization include utilization levels of logic and memory resources of a target device, a number of control sets, a number of fanouts, and the runtime of the implementation flow through the logic optimization stage.

In response to the post-optimization model indicating a short runtime, the inference engine can signal the design tool to execute stages of the implementation flow that follow the logic optimization stage by a single process. In response to the post-optimization model indicating a long runtime, the inference engine can signal the design tool to execute stages of the implementation flow that follow the logic optimization stage by a plurality of processes. The single process or multi-process flow can continue through to completion of the implementation flow, or alternatively, through the next stage/phase at which a prediction model can be applied to the circuit design features. For example, the single process multi-process flow can continue through the placement and routing stages, or continue through completion of the partition phase 116 of placement.

In the example flow, the next point at which a classification model can be applied is in response to completion of the partition phase 116 of the placement stage 112. In the placement stage, the design tool assigns cells of the circuit design to locations on a target integrated circuit device/die. The exemplary placement stage can include the partition phase 116, followed by a global placement phase 118, and a detailed placement phase 120.

In the partitioning phase 116, portions of the circuit design can be assigned to different partitions of the target device. For example, a target device can be constructed as single package having multiple IC dies, and each die can be a partition. Each portion of the circuit design can be assigned to one of the dies.

In response to completing the partition phase 116 the design tool invokes the inference engine 106 to predict whether the implementation flow will have a short or long runtime based on application of the post-partition model to circuit design features that are available post-partitioning. Examples of features that can be extracted from the circuit design post-partitioning include utilization levels of logic and memory resources within the partitions, a number of control sets, a number of fanouts, a number of nets that cross partitions, pin densities within the partitions, and the runtime of the implementation flow through the partitioning phase.

In response to the post-partitioning model indicating a short runtime, the inference engine can signal the design tool to execute stages of the implementation flow that follow the partitioning phase by a single process. In response to the post-partitioning model indicating a long runtime, the inference engine can signal the design tool to execute stages of the implementation flow that follow the partitioning phase by a plurality of processes. The single process or multi-process flow can continue through to completion of the implementation flow, or alternatively, through the next stage/phase at which a prediction model can be applied to the circuit design features. For example, the single process multi-process flow can continue through the placement and routing stages, or continue through completion of the of the placement stage 112. In the example flow, the next point at which a classification model can be applied is in response to completion of the placement stage 112 (after detailed placement 120).

In response to completing the placement stage 112 the design tool invokes the inference engine 106 to predict whether the implementation flow will have a short or long runtime based on application of the post-placement model to circuit design features that are available post-placement. Examples of features that can be extracted from the circuit design post-partitioning include utilization levels of logic and memory resources within the partitions, a number of control sets, a number of fanouts, a number of nets that cross partitions, pin densities within the partitions, levels of congestion in the partitions, wirelength features, and the runtime of the implementation flow through the placement stage.

In response to the post-placement model indicating a short runtime, the inference engine can signal the design tool to execute stages of the implementation flow that follow the placement stage by a single process. In response to the post-placement model indicating a long runtime, the inference engine can signal the design tool to execute stages of the implementation flow that follow the placement phase by a plurality of processes. The single process or multi-process flow can continue through to completion of the implementation flow, or alternatively, through the next stage/phase at which a prediction model can be applied to the circuit design features.

Figure 2:
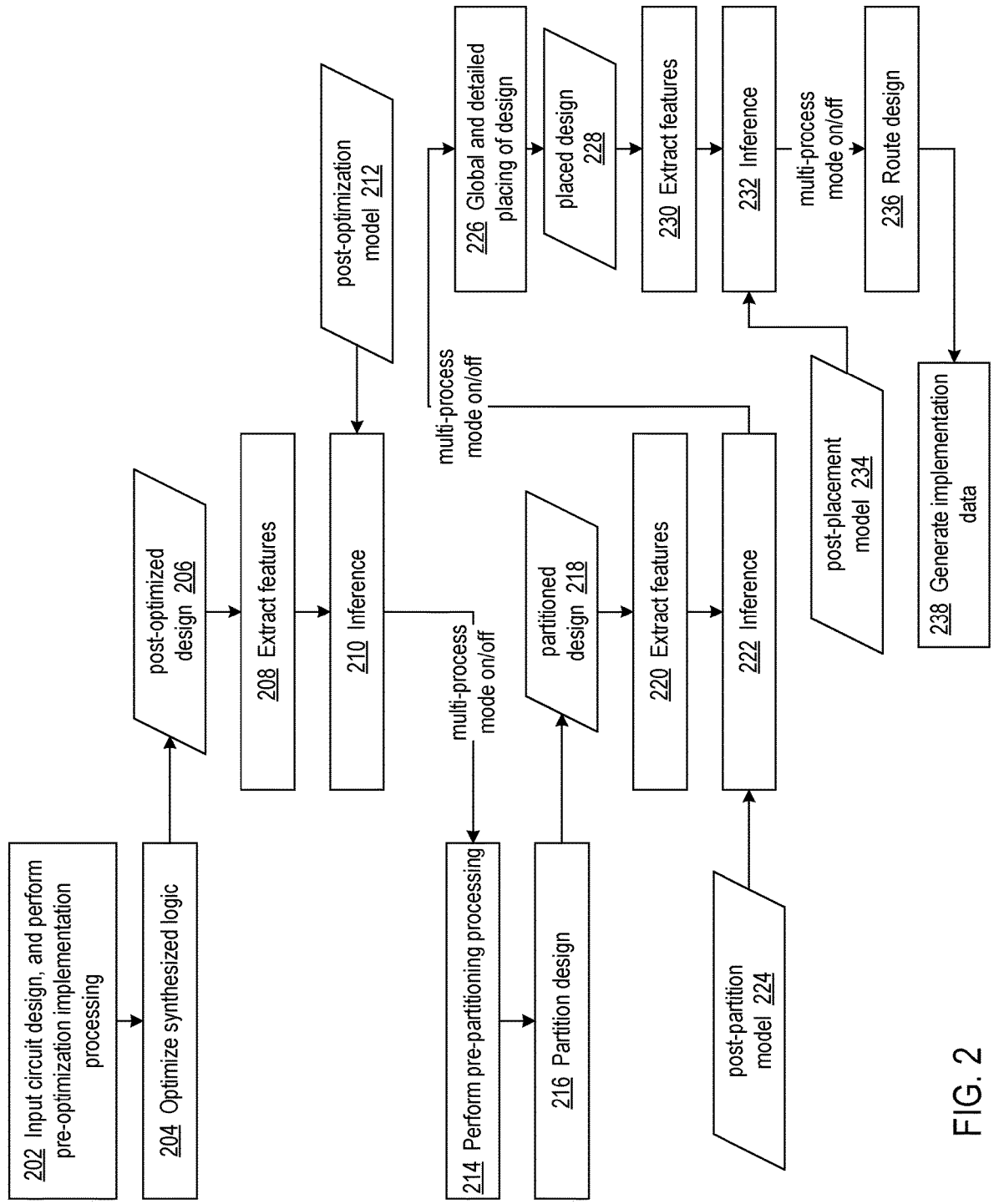
FIG. 2 shows a flowchart of an exemplary process in which runtime prediction models are used to predict the length of the runtime of the implementation flow at multiple stages of an implementation flow.

FIG. 2 shows a flowchart of an exemplary process in which runtime prediction models are used to predict the length of the runtime of the implementation flow at multiple stages of an implementation flow. At block 202, a design tool inputs a circuit design and performs initial steps of an implementation flow, including, for example, logic synthesis.

At block 204, the design tool performs logic optimization, which results in post-optimized design 206. The design tool at block 208 extracts features from the post-optimized design that are relevant to predicting whether the runtime of the implementation flow will be short or long. The features can include utilization levels of logic and memory resources of a target device, a number of control sets, a number of fanouts, and the runtime of the implementation flow through the logic optimization stage.

At block 210, the design tool initiates inference, which applies the post-optimization model 212 to the features extracted at block 208. The post-optimization model returns a value that indicates either a short runtime or a long runtime of the implementation flow is likely.

Based on the indication from the post-optimization model, the design tool initiates placement processing at block 214, either as a single process or as multiple processes, beginning with any processing that precedes partitioning ("pre-partitioning processing"). At block 216, the design tool partitions the circuit design, which results in partitioned design 218.

The design tool at block 220 extracts features from the partitioned design 218 that are relevant to predicting whether the runtime of the implementation flow will be short or long. The features can include utilization levels of logic and memory resources within the partitions, a number of control sets, a number of fanouts, a number of nets that cross partitions, pin densities within the partitions, and the runtime of the implementation flow through the partitioning phase.

At block 222, the design tool initiates inference, which applies the post-partitioning model 224 to the features extracted at block 220. The post-partitioning model returns a value that indicates either a short runtime or a long runtime of the implementation flow is likely.

Based on the indication from the post-partitioning model, the design tool initiates additional placement processing (e.g., global placement and detailed placement), either as a single process or as multiple processes. At block 226, the design tool places elements of the circuit design, which results in placed design 228.

The design tool at block 230 extracts features from the placed design 228 that are relevant to predicting whether the runtime of the implementation flow will be short or long. The features can include utilization levels of logic and memory resources within the partitions, a number of control sets, a number of fanouts, a number of nets that cross partitions, pin densities within the partitions, levels of congestion in the partitions, wirelength features, and the runtime of the implementation flow through the placement stage.

At block 232, the design tool initiates inference, which applies the post-placement model 234 to the features extracted at block 230. The post-placement model returns a value that indicates either a short runtime or a long runtime of the implementation flow is likely.

Based on the indication from the post-partitioning model, the design tool initiates the routing stage, either as a single process or as multiple processes. At block 236, the design tool routes the circuit design.

At block 238, the design tool generates implementation data. For example, bitstream generation tools may be executed to generate implementation data for an FPGA. Other tools can generate implementation data from which an application-specific (ASIC) can be fabricated. A circuit can be implemented by way of configuring a programmable IC with the configuration data or fabricating, making, or producing an ASIC from the implementation data, thereby creating a circuit that operates according to the resulting circuit design.

Figure 3:
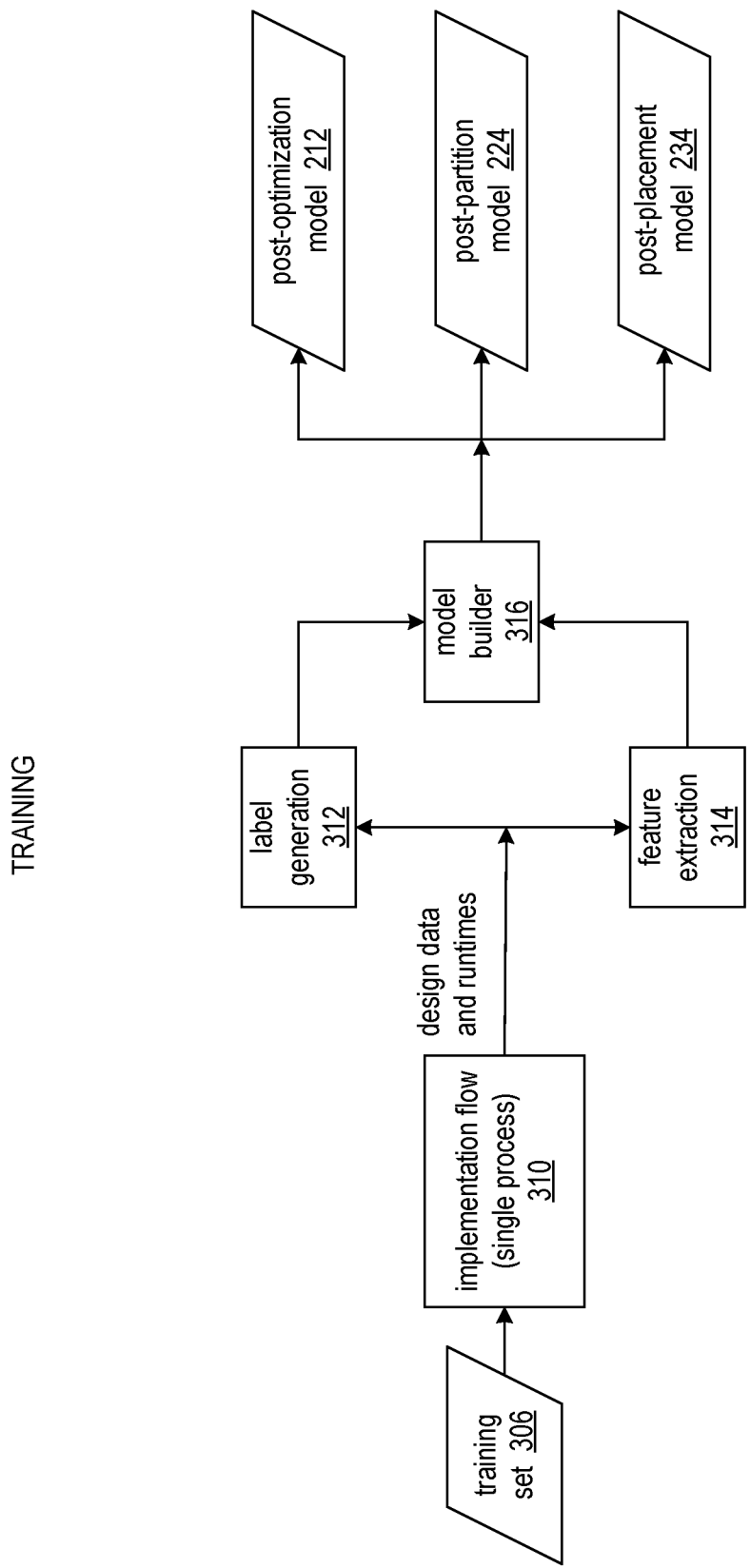
FIG. 3 shows a data flow and process flow for creating classification models that can be used at different stages of an implementation flow by a design tool to predict whether the implementation flow will have a short runtime or a long runtime.

FIG. 3 shows a data flow and process flow for creating classification models that can be used at different stages of an implementation flow by a design tool to predict whether the implementation flow will have a short runtime or a long runtime. In constructing the classification models 212, 224, and 234, single process implementation flows 310 are performed on circuit designs in a training set 306.

Each implementation flow outputs circuit design data and durations of runtimes at one or more stages of the flow. At each stage at which the design data is output, the design data is the state of the design that results from the implementation flow through that stage of the flow. For example, the states of the circuit design can be output at completion of the optimization stage, at completion of the partitioning phase of placement, and at completion of the placement stage.

In addition to the circuit design data output from the implementation flows, runtimes of the implementation flow through completion of the corresponding stages/phases are output. The runtimes are provided as input to the label generation process 312, and the circuit design data is provided as input to the feature extraction process 314.

For each runtime provided from the implementation flow, the label generation process determines a label value that indicates the duration of the runtime. According to the exemplary approaches, the label value can be either logical 0 or logical 1 to indicate either a short runtime or a long runtime. A runtime threshold can be used to distinguish between short runtimes and long runtimes. For example, if the runtime of the implementation flow on a circuit design is greater than the threshold, the label associated with the associated feature set can be value indicating a long runtime (e.g., logical value 1). If the runtime of the implementation flow on a circuit design is less than the threshold, the label associated with the associated feature set can be value indicating a short runtime (e.g., logical value 0). In an alternative approach, more than two label values (e.g., characters or integers) can be employed to indicate more than two ranges of runtime durations.

For each set of circuit design data output from the implementation flow (e.g., at each stage/phase of each flow), the feature extraction process 314 determines a feature set exhibited by the design data. For example, from the design data available upon completion of the optimization stage, the features can include utilization levels of logic and memory resources of a target device, a number of control sets, a number of fanouts, and the runtime of the implementation flow through the logic optimization stage. From the design data available upon completion of the partitioning phase of the placement stage, the features can include utilization levels of logic and memory resources within the partitions, a number of control sets, a number of fanouts, a number of nets that cross partitions, pin densities within the partitions, and the runtime of the implementation flow through the partitioning phase. From the design data available upon completion of the placement stage, the features can include utilization levels of logic and memory resources within the partitions, a number of control sets, a number of fanouts, a number of nets that cross partitions, pin densities within the partitions, levels of congestion in the partitions, wirelength features, and the runtime of the implementation flow through the placement stage.

Each feature set and corresponding label value are provided as input to the model builder process 316. The model builder builds classification models 212, 224, and 234, such as a random forest, according to the label values and associated feature sets.

Figure 4:
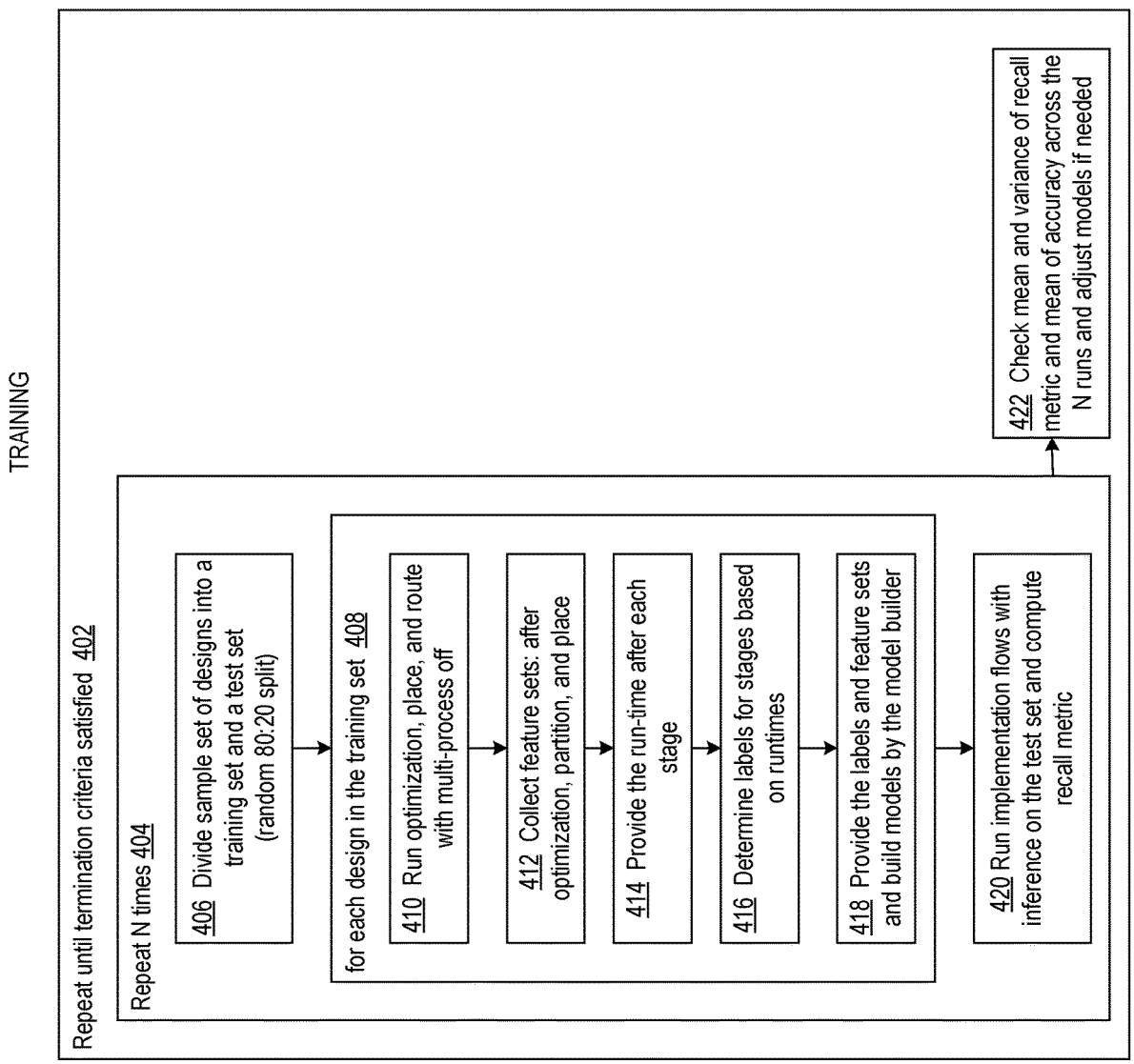
FIG. 4 shows a flowchart of an exemplary process for training implementation flow runtime prediction model(s)

FIG. 4 shows a flowchart of an exemplary process for training implementation flow runtime prediction model(s). The processing of block 402 can be performed until termination criteria are satisfied for training of the model(s). In an exemplary approach, assessing the termination criteria can include evaluating a recall metric.

The recall metric can be used to indicate an extent to which a trained model incorrectly identifies long runtime designs as short runtime designs ("false negatives"). The recall metric can be computed as:

(100*(1−num_designs_predicted_short/num_designs_actually_long)), where num_designs_predicted_short is the number of designs predicted to have shorter runtimes, and num_designs_actually_long is the number of designs known to have longer runtimes. The recall metric indicates the percentage of designs that were correctly identified as long runtime designs. The recall metric can be calculated at the end of each of the N training runs of block 404. If the recall metric is too low, the feature sets can be reevaluated and changed based on features appearing in the false negative designs of the test set.

The training steps of block 404 are repeated multiple times (e.g., 10 times) in order to increase the confidence in the inference using the trained model(s). At block 406, a sample set of circuit designs is divided into a training set and a test set. The training set includes 80% of the sample designs, and the test set includes 20% of the designs. The selection of designs for the training set from the sample set can be a pseudo-random selection with certain restrictions. For example, to ensure the training set is similar to the test set, the selection maintains equal fractions of long runtime designs in the training set and the test set. The runtimes of the implementation flows (single process) on the designs in the sample set are known a priori and are used in assessing the accuracy of the trained models.

The processing of block 408 is performed for each design in the training set. At block 410, the design tool runs an implementation flow as a single process on each design in the training set. Upon completion of each relevant stage/phase of the implementation flow, at block 412 the feature extraction process collects respective features sets. For example, feature sets can be extracted upon completion of logic optimization, upon completion of partitioning, and upon completion of placement.

At block 414, upon completion of each stage/phase the design tool provides the duration of the runtime of the implementation flow from initiation of the flow through completion of the stage/phase. The label generation process determines label values at block 416 based on the runtimes provided from the design tool.

The labels and associated feature sets are provided to the model builder, which builds the classification models, at block 418. The model builder can be a random forest classifier that has many hyperparameters (such has maximum depth of the trees, criterion for impurity reduction etc.) that control the complexity of the model. The GridSearchCV tool, which is available in scikit-learn, can be used to tune the hyperparameters. The tool uses the k-fold cross validation method to train and validate each hyperparameter set.

At block 420, after training the classification models based on the designs in the training set, the design tool runs implementation flows on the designs in the test set using inference with the trained models. Upon completion of each stage/phase implementation flow on a design, respective counts (one count per stage) of the number of designs predicted to have short runtimes are adjusted according to the predicted runtimes. The numbers of designs predicted to have short runtimes are used in computing values of the recall metric for the different models.

At block 422, the mean and variance of the values of the recall metric, along with the means of accuracy of the different models are computed for the multiple training runs of block 404. If the variance and accuracy are within application-specific bounds, training of the models can be terminated. Otherwise, feature sets can be adjusted.

Figure 5:
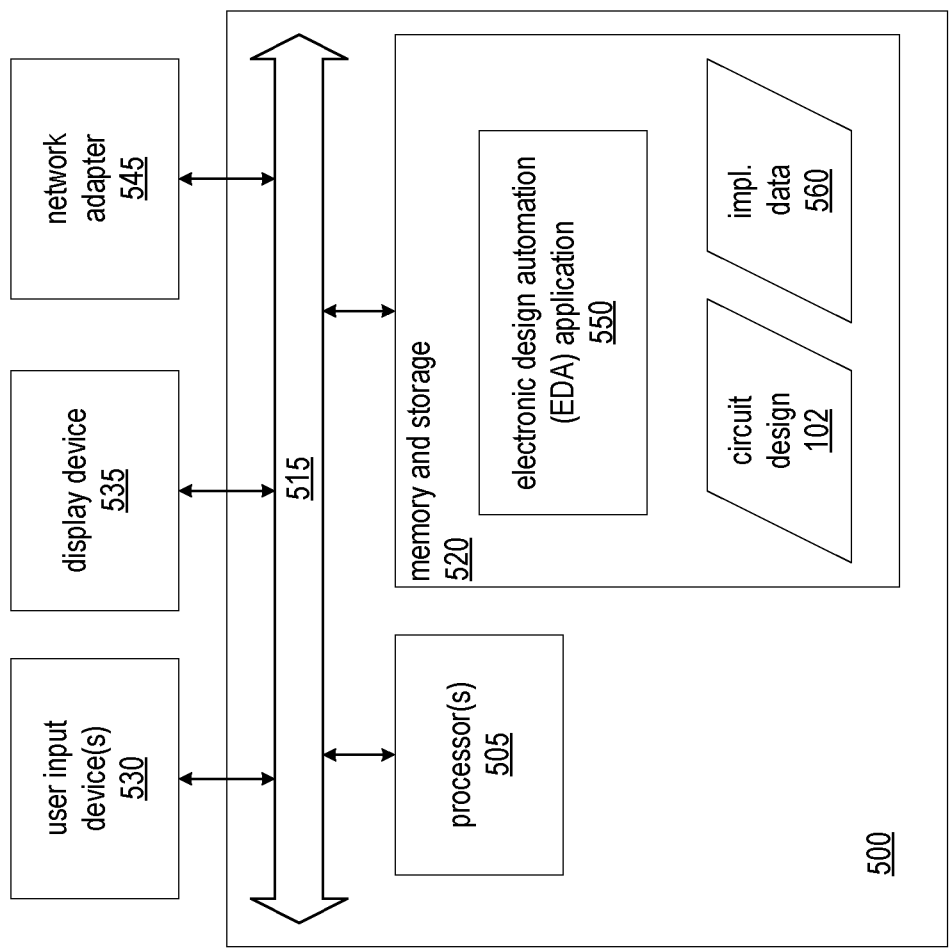
FIG. 5 is a block diagram illustrating an exemplary data processing system.

FIG. 5 is a block diagram illustrating an exemplary data processing system (system) 500. System 500 is an example of an EDA system. As pictured, system 500 includes at least one processor circuit (or "processor"), e.g., a central processing unit (CPU) 505 coupled to memory and storage arrangement 520 through a system bus 515 or other suitable circuitry. System 500 stores program code and circuit design 102 within memory and storage arrangement 520. Processor 505 executes the program code accessed from the memory and storage arrangement 520 via system bus 515. In one aspect, system 500 is implemented as a computer or other data processing system that is suitable for storing and/or executing program code. It should be appreciated, however, that system 500 can be implemented in the form of any system including a processor and memory that is capable of performing the functions described within this disclosure.

Memory and storage arrangement 520 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 500 may also include one or more cache memories (not shown) that provide temporary storage of at least some program code and data in order to reduce the number of times program code and data must be retrieved from local memory and persistent storage during execution.

Input/output (I/O) devices such as user input device(s) 530 and a display device 535 may be optionally coupled to system 500. The I/O devices may be coupled to system 500 either directly or through intervening I/O controllers. A network adapter 545 also can be coupled to system 500 in order to couple system 500 to other systems, computer systems, remote printers, and/or remote storage devices through intervening private or public networks. Modems, cable modems, Ethernet cards, and wireless transceivers are examples of different types of network adapter 545 that can be used with system 500.

Memory and storage arrangement 520 may store an EDA application 550, which can implement the processes disclosed herein. EDA application 550, being implemented in the form of executable program code, is executed by processor(s) 505. As such, EDA application 550 is considered part of system 500. System 500, while executing EDA application 550, receives and operates on circuit design 100. In one aspect, system 500 performs an implementation flow on circuit design 102 using the classification models and inference approaches described herein. System 500 generates implementation data 560 from the circuit design. In addition, the EDA application 550 can train the classification models (FIG. 3) according to the processes disclosed in FIG. 4.

EDA application 550, circuit design 102, implementation data 560, and any data items used, generated, and/or operated upon by EDA application 550 are functional data structures that impart functionality when employed as part of system 500 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The methods and systems are thought to be applicable to a variety circuit design implementation flows for efficiently allocating computational resources. Other aspects and features will be apparent to those skilled in the art from consideration of the specification. The methods and systems may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:
    processing a circuit design through one or more stages of an implementation flow by a design tool;
    identifying features of the circuit design by the design tool in response to completion of the one or more stages;
    applying a classification model to the features, wherein the classification model indicates whether an implementation flow on the circuit design is likely to have a runtime within a first range of runtimes or a runtime within a second range of runtimes;
    executing stages of the implementation flow following the one or more stages by the design tool in a single process in response to the classification model indicating the implementation flow on the circuit design is likely to have a runtime within the first range of runtimes; and
    executing stages of the implementation flow following the one or more stages by the design tool in a plurality of processes in response to the classification model indicating the implementation flow on the circuit design is likely to have a runtime within the second range of runtimes.

2. The method of claim 1, wherein runtimes in the first range of runtimes are less than a runtime threshold, and runtimes in the second range of runtimes are greater than the runtime threshold.

3. The method of claim 1, comprising:
processing the circuit design through a logic optimization stage of the implementation flow by the design tool;
wherein the identifying includes identifying features of the circuit design in response to completion of the logic optimization stage;
executing stages of the implementation flow following the logic optimization stage, by the single process in response to the classification model indicating the implementation flow on the circuit design is likely to have a runtime within the first range of runtimes; and
executing stages of the implementation flow following the logic optimization stage, by the plurality of processes in response to the classification model indicating the implementation flow on the circuit design is likely to have a runtime within the second range of runtimes.

4. The method of claim 3, wherein the identifying features of the circuit design in response to completion of the logic optimization stage includes:
determining utilization levels of logic and memory resources of a target device;
determining a number of control sets;
determining a number of fanouts;
determining a runtime of the implementation flow through the logic optimization stage; and
wherein the features include the utilization levels, number of control sets, number of fanouts, and the runtime of the implementation flow through the logic optimization stage.

5. The method of claim 1, comprising:
processing the circuit design through a logic partitioning stage of the implementation flow by the design tool;
wherein the identifying includes identifying features of the circuit design in response to completion of the logic partitioning stage;
executing stages of the implementation flow following the logic partitioning stage, by the single process in response to the classification model indicating the implementation flow on the circuit design is likely to have a runtime within the first range of runtimes; and
executing stages of the implementation flow following the logic partitioning stage, by the plurality of processes in response to the classification model indicating the implementation flow on the circuit design is likely to have a runtime within the second range of runtimes.

6. The method of claim 5, wherein the identifying features of the circuit design in response to completion of the logic partitioning stage includes:
determining a number of control sets;
determining a number of fanouts;
determining a number of nets that cross partitions;
determining pin densities within the partitions;
determining utilization levels of logic resources within the partitions;
determining a runtime of the implementation flow through the logic partitioning stage; and
wherein the features include the utilization levels, number of control sets, number of fanouts, number of nets that cross partitions, pin densities within the partitions, utilization levels of logic resources within the partitions, and the runtime of the implementation flow through the logic partitioning stage.

7. The method of claim 1, comprising:
processing the circuit design through a placement stage of the implementation flow by the design tool;
wherein the identifying includes identifying features of the circuit design in response to completion of the placement stage;
executing stages of the implementation flow following the placement stage, by the single process in response to the classification model indicating the implementation flow on the circuit design is likely to have a runtime within the first range of runtimes; and
executing stages of the implementation flow following the placement stage, by the plurality of processes in response to the classification model indicating the implementation flow on the circuit design is likely to have a runtime within the second range of runtimes.

8. The method of claim 7, wherein the identifying features of the circuit design in response to completion of the placement stage includes:
determining a number of control sets;
determining a number of fanouts;
determining a number of nets that cross partitions;
determining pin densities within the partitions;
determining utilization levels of logic resources within the partitions;
determining levels of congestion in the partitions;
determining wirelength features;
determining a runtime of the implementation flow through the placement stage; and
wherein the features include the utilization levels, number of control sets, number of fanouts, number of nets that cross partitions, pin densities within the partitions, utilization levels of logic resources within the partitions, levels of congestion, wirelength features, and the runtime of the implementation flow through the placement stage.

9. The method of claim 1, comprising:
generating implementation data from the circuit design by the design tool after executing the stages of the implementation flow, wherein the implementation data is suitable for making an integrated circuit; and
making an integrated circuit device based on the implementation data.

10. A method comprising:
processing a circuit design through a first stage of an implementation flow by a design tool;
identifying first features of the circuit design in response to completion of the first stage;
applying a first classification model to the first features, wherein the first classification model indicates whether the design tool should perform a second stage of the implementation flow as a plurality of parallel processes or as a single process based on the first features;
executing the second stage by the plurality of processes in response to the first classification model indicating the design tool should perform the second stage by the plurality of parallel processes;
executing the second stage by the single process in response to first classification model indicating the design tool should perform the second stage as the single process;
identifying second features of the circuit design in response to completion of the second stage;
applying a second classification model to the second features, wherein the second classification model indicates whether the design tool should perform a third stage of the implementation flow as a plurality of parallel processes or as a single process based on the second features;

executing the third stage by the plurality of processes in response to the second classification model indicating the design tool should perform the third stage by the plurality of parallel processes; and executing the third stage by the single process in response to the second classification model indicating the design tool should perform the third stage as the single process.

11. The method of claim 10, wherein processing the circuit design through the first stage of the implementation flow includes performing logic optimization.

12. A system comprising:
a processor; and
a memory arrangement coupled to the processor, wherein the memory arrangement is configured with instructions of a design tool for processing a circuit design, and in response to execution of the instructions, the processor performs operations including:
processing a circuit design through one or more stages of an implementation flow;
identifying features of the circuit design in response to completion of the one or more stages;
applying a classification model to the features, wherein the classification model indicates whether an implementation flow on the circuit design is likely to have a runtime within a first range of runtimes or a runtime within a second range of runtimes;
executing stages of the implementation flow following the one or more stages in a single process in response to the classification model indicating the implementation flow on the circuit design is likely to have a runtime within the first range of runtimes; and
executing stages of the implementation flow following the one or more stages in a plurality of processes in response to the classification model indicating the implementation flow on the circuit design is likely to have a runtime within the second range of runtimes.

13. The system of claim 12, wherein runtimes in the first range of runtimes are less than a runtime threshold, and runtimes in the second range of runtimes are greater than the runtime threshold.

14. The system of claim 12, wherein the memory arrangement is configured with additional instructions that when executed by the processor cause the processor to perform operations including:
processing the circuit design through a logic optimization stage of the implementation flow;
wherein the identifying includes identifying features of the circuit design in response to completion of the logic optimization stage;
executing stages of the implementation flow following the logic optimization stage, by the single process in response to the classification model indicating the implementation flow on the circuit design is likely to have a runtime within the first range of runtimes; and
executing stages of the implementation flow following the logic optimization stage, by the plurality of processes in response to the classification model indicating the implementation flow on the circuit design is likely to have a runtime within the second range of runtimes.

15. The system of claim 14, wherein the instructions for identifying features of the circuit design in response to completion of the logic optimization stage include instructions for:
determining utilization levels of logic and memory resources of a target device;
determining a number of control sets;
determining a number of fanouts; and
determining a runtime of the implementation flow through the logic optimization stage; and
wherein the features include the utilization levels, number of control sets, number of fanouts, and the runtime of the implementation flow through the logic optimization stage.

16. The system of claim 12, wherein the memory arrangement is configured with additional instructions that when executed by the processor cause the processor to perform operations including:
processing the circuit design through a logic partitioning stage of the implementation flow, wherein the instructions for identifying include instructions for identifying features of the circuit design in response to completion of the logic partitioning stage;
executing stages of the implementation flow following the logic partitioning stage, by the single process in response to the classification model indicating the implementation flow on the circuit design is likely to have a runtime within the first range of runtimes; and
executing stages of the implementation flow following the logic partitioning stage, by the plurality of processes in response to the classification model indicating the implementation flow on the circuit design is likely to have a runtime within the second range of runtimes.

17. The system of claim 16, wherein the instructions for identifying features of the circuit design in response to completion of the logic partitioning stage include instructions for:
determining a number of control sets;
determining a number of fanouts;
determining a number of nets that cross partitions;
determining pin densities within the partitions;
determining utilization levels of logic resources within the partitions; and
determining a runtime of the implementation flow through the logic partitioning stage; and
wherein the features include the utilization levels, number of control sets, number of fanouts, number of nets that cross partitions, pin densities within the partitions, utilization levels of logic resources within the partitions, and the runtime of the implementation flow through the logic partitioning stage.

18. The system of claim 12, wherein the memory arrangement is configured with additional instructions that when executed by the processor cause the processor to perform operations including:
processing the circuit design through a placement stage of the implementation flow, wherein the instructions for identifying include instructions for identifying features of the circuit design in response to completion of the placement stage;
executing stages of the implementation flow following the placement stage, by the single process in response to the classification model indicating the implementation flow on the circuit design is likely to have a runtime within the first range of runtimes; and
executing stages of the implementation flow following the placement stage, by the plurality of processes in response to the classification model indicating the implementation flow on the circuit design is likely to have a runtime within the second range of runtimes.

19. The system of claim 18, wherein the instructions for identifying features of the circuit design in response to completion of the placement stage include instructions for:
determining a number of control sets;

determining a number of fanouts;
determining a number of nets that cross partitions;
determining pin densities within the partitions;
determining utilization levels of logic resources within the partitions;
determining levels of congestion in the partitions;
determining wirelength features; and
determining a runtime of the implementation flow through the placement stage; and
wherein the features include the utilization levels, number of control sets, number of fanouts, number of nets that cross partitions, pin densities within the partitions, utilization levels of logic resources within the partitions, levels of congestion, wirelength features, and the runtime of the implementation flow through the placement stage.

20. The system of claim 12, wherein the memory arrangement is configured with additional instructions that when executed by the processor cause the processor to perform operations including:
generating implementation data from the circuit design after executing the stages of the implementation flow, wherein the implementation data is suitable for making an integrated circuit; and
making an integrated circuit device based on the implementation data.

* * * * *